(12) United States Patent
Harris

(10) Patent No.: US 6,597,035 B1
(45) Date of Patent: Jul. 22, 2003

(54) ROBUST REFERENCE SENSING CELL FOR FLASH MEMORY

(75) Inventor: George E. Harris, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 24 days.

(21) Appl. No.: 09/615,134

(22) Filed: Jul. 13, 2000

Related U.S. Application Data

(60) Provisional application No. 60/147,064, filed on Aug. 4, 1999.

(51) Int. Cl.[7] .............................................. H01L 27/108

(52) U.S. Cl. ...................................... 257/315; 257/314

(58) Field of Search .................................. 257/314–326

(56) References Cited

U.S. PATENT DOCUMENTS

| | | | | | |
|---|---|---|---|---|---|
| 5,377,140 A | * | 12/1994 | Usuki | .......................... | 365/154 |
| 5,460,989 A | * | 10/1995 | Wake | .......................... | 437/43 |
| 6,052,304 A | * | 4/2000 | Chritz | .................... | 365/185.08 |
| 6,281,558 B1 | * | 8/2001 | Sayama et al. | ............. | 257/391 |

FOREIGN PATENT DOCUMENTS

JP    10-289960    * 10/1998    ....... H01L/21/8247

* cited by examiner

*Primary Examiner*—Tom Thomas
*Assistant Examiner*—Ori Nadav
(74) *Attorney, Agent, or Firm*—Peter K. McLarty; W. James Brady, III; Frederick J. Telecky, Jr.

(57) ABSTRACT

A robust reference sensing cell for FLASH memory is formed. The cell utilizes floating gate transistors with a drain transition region concentration gradient that is less than the drain transition region concentration gradient of the floating gate transistors used to form the FLASH memory cell array.

3 Claims, 1 Drawing Sheet

ROBUST REFERENCE SENSING CELL FOR FLASH MEMORY

This application claims priority under 35 USC §119(e)(1) of provisional application No. 60/147,064 filed Aug. 4, 1999.

CROSS REFERENCE TO RELATED PATENT/PATENT APPLICATIONS

The following commonly assigned patent/patent applications are hereby incorporated herein by reference:

| Pat. No. /Ser. No. | Filing Date | TI Case No. |
|---|---|---|
| 60/109, 729 | 11/23/98 | TI-28390P1 |

FIELD OF THE INVENTION

The present invention relates to skewed reference circuits for floating-gate memories.

BACKGROUND OF THE INVENTION

Semiconductor memories which do not lose their contents when the power is disconnected are referred to as nonvolatile memories. The most common types of nonvolatile semiconductor memories are those which exploit the properties of a floating-gate transistor. Such a transistor differs from a normal metal oxide semiconductor (MOS) transistor in that a dielectrically isolated floating gate is interposed between a control gate and the channel. (Thus, the two gates are capacitively coupled to each other and to the channel.) The lower gate is called a "floating" gate, because it is electrically isolated from the control gate. By injecting charges into the floating gate, the effective threshold voltage of the MOS transistor (as seen from the upper gate) can be changed. By applying an appropriate voltage to the control gate, and observing whether the transistor turns on, the state of the cell (i.e. whether charge is stored on the floating gate) can be detected. Injecting charges into the floating gate of a MOS memory cell is known as "programming" and the removal of the charge from floating gate is known as "erase". To read the state of the memory cell a read voltage is applied to the gate and drain of the memory cell. If the transistor has been programmed, then the application of the read voltages to the cell will not result in the formation of a channel because of the high transistor threshold voltage or programmed threshold voltage. Here the memory cell is said to be in the logic "0" state. In the erase state there is no stored charge on the floating gate and the application of the read voltages will result in the formation of a channel. In this case the cell is said to be in the logic "1" state. The two main mechanisms used to program a memory cell are Fowler-Nordheim tunneling or channel hot carrier (CHC) injection. The cells can be erased electrically using Fowler-Norheim tunneling or through the use of ultraviolet (UV) radiation. Semiconductor memory cells which use electrical methods for both programming and erase are known as FLASH EEPROM memory or simply as FLASH memory. All FLASH memory is based on the floating gate concept described above. The FLASH cells can be programmed individually but the content of the entire memory array is always cleared (erased) in one step.

Most FLASH memory uses CHC injection for programming and Fowler-Nordheim tunneling for erase. CHC injection occurs when a relatively large voltage (programming voltage) is placed on the control gate and the drain with the source grounded. The gate and drain voltages produce high electric fields close to the drain causing the channel electrons to gain significant energy in this region of the channel. Some of the channel electrons will gain enough energy to surmount the 3.2 eV gate dielectric barrier and become trapped in the floating gate. For Fowler-Nordheim erase a relatively large erase voltage is placed on the source and the control gate and drain are grounded. The trapped charge on the floating gate will tunnel through the gate dielectric into the source contact.

CHC injection is a well known degradation mechanism in MOS transistors. Repeated CHC injection can result in permanent damage to the gate dielectric of the MOS transistor or FLASH memory cell causing the transistor or cell to become inoperable. For MOS transistors in general, this degradation is caused by broken bonds in the silicon/silicon dioxide interface, generation of interface and bulk traps, and charge trapping, eventually leading to breakdown. In FLASH memory, electron trapping in the tunnel oxide builds up a permanent negative charge, thereby reducing the electric field and the injected electrons. For a constant program voltage or program time, this reduces the programming threshold voltage of the cell, resulting in the threshold window closure problem. Significant window closure typically occurs after about $10^5$ cycles (i.e. programming and erase steps) but can be extended using methods such as error correcting codes.

As stated above, in FLASH memory, a logic "1" is defined as the state in which a channel forms at a low threshold voltage (Vt). This occurs in a FLASH memory cell with no excess charge stored on the floating gate. A logic "0" is the state in which the threshold voltage (Vt) of the memory cell is raised (programmed) such that the channel does not form under read voltage conditions. The margin between the threshold voltages of erased FLASH memory cells and of programmed FLASH memory cells must be such that erased cells have threshold voltages below a reference value and programmed cells have threshold voltages above a reference value. This reference value is determined by comparing the selected memory cell to a reference cell in such a way that the reference cell defines a condition, current or voltage, that resides between the logic "1" and logic "0" state of the selected cell. Both the reference cell and the selected cell have the same voltages applied to their control gates during read operations. The comparison to determine whether a logic "1" or a logic "0" is stored on the selected cell is performed by a sense amplifier.

In FLASH memory arrays, a single reference cell can be used to reference many memory cells. For example a single reference cell can be used as the reference for 8, 16, 32, 64 etc. . . memory array columns with each column containing many memory cells. Thus, a reference cell can see 8, 16, 32, 64, etc. . . times more read voltages than the memory array cells. In FLASH memory circuits, the same transistor is typically used for the memory cell and the reference cell. The FLASH memory cell is designed for efficient CHC injection and an identical reference cell will experience some CHC injection during each read operation. Despite the fact that the FLASH memory cell is designed to minimize degradation caused by CHC injection, the reference cell is operated many more times than the memory cell and could have a shorter operating life thus limiting the useful operation lifetime of the FLASH memory circuit. In addition, using the same floating gate transistor for the memory cell and the reference cell imposes unnecessary device deign, process control and circuit design constraints on the reference cell.

SUMMARY OF INVENTION

The instant invention is a method of forming a semiconductor memory with a robust reference sensing cell. The semiconductor memory circuit comprises: an array of memory cells wherein each memory cell comprises a floating gate transistor having a first transistor gate length, a first transistor gate width, and a first drain transition region concentration gradient; and at least one reference cell comprising a floating gate transistor having a second transistor gate length, a second transistor gate width, and a second drain transition region concentration gradient wherein said first drain transition region concentration gradient is greater than said second drain transition region concentration gradient.

Advantages of the instant invention include reduced CHC injection in the reference cell during read operations. Other technical advantages will be readily apparent to one skilled in the art from the following Figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1:
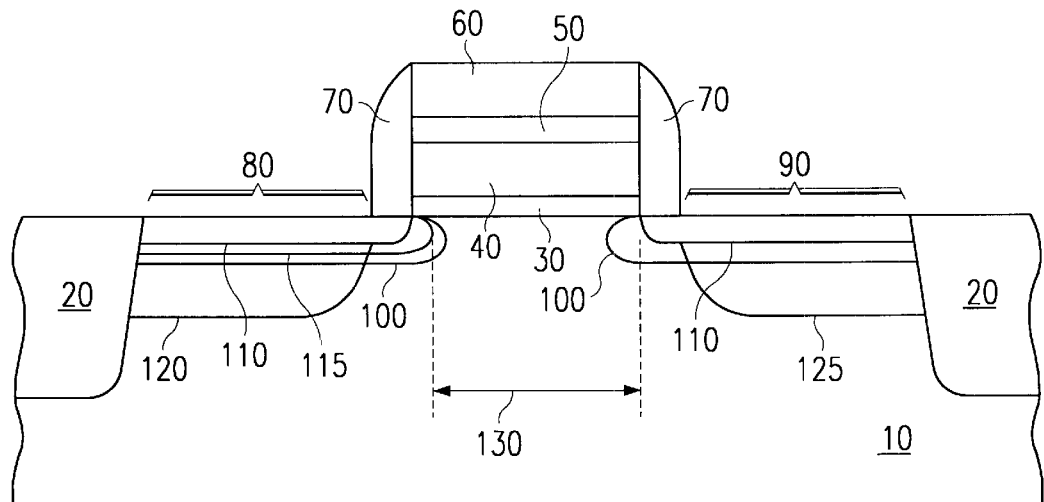
FIG. 1 is an schematic diagram of a typical FLASH memory cell.

Illustrated in FIG. 1 is a FLASH memory cell according to an embodiment of the instant invention. The semiconductor body 10 comprises part of a bulk substrate wafer or an epitaxial layer formed on a bulk substrate. The FLASH cell can also be formed in a p-well region formed by implanting the semiconductor body 10 with p-type dopants. Typically, the starting semiconductor body 10 is p-type with a resistivity of about 1.1–2.8 ohm-cm. If a p-well is formed it could contain a number of implants such as a well implant, a threshold voltage adjust implant, a punch through implant, and a channel stop implant. Isolations structures 20 are formed in the semiconductor body 10 using shallow trench isolation (STI). These STI structures 20 are generally formed prior to the fabrication of the FLASH cell. The STI structures 20 are formed by etching a trench into the semiconductor body 10. The trench is generally on the order of 0.2 to 8.5 μm in depth. The trench is filled with a dielectric material to electrically isolate the active regions of the semiconductor body 10 between the STI structures 20. The trench dielectric material may comprise silicon dioxide, silicon nitride, or a combination thereof. It will be understood that the trench dielectric material may comprise other suitable dielectric materials without departing from the scope of the present invention.

The gate structure (or gate stack) of the FLASH cell shown in FIG. 1 comprises a gate dielectric 30, a floating gate 40, an interstitial dielectric 50, and a control gate 60. The gate dielectric 30 is formed outwardly from the semiconductor body 10, and the floating gate 40 is formed outwardly from the gate insulator 30. The interstitial dielectric 50 is formed between the floating gate 40 and the control gate 60 and operates to electrically isolate the floating gate 40 from the control gate 60. The gate dielectric 30 is generally grown on the surface of the semiconductor body 10. The gate dielectric 30 may comprise oxide or nitride on the order of 25 to 500 A in thickness. It will be understood that the gate dielectric 30 may comprise other materials suitable for insulating semiconductor elements. The floating gate 40 and the control gate 60 are conductive regions. The gates 40 and 60 generally comprise a polycrystalline silicon material (polysilicon) that is doped with impurities to render the polysilicon conductive. The thicknesses of the gates 40 and 60 are generally on the order of 100 nanometers and 300 nanometers, respectively. It will be understood that the gates 40 and 60 may comprise other suitable conductive materials without departing from the scope of the present invention. The interstitial dielectric 50 may comprise oxide, nitride, or a heterostructure formed by alternating layers of oxide and nitride. The interstitial dielectric 50 is on the order of 5 to 40 nanometers in thickness. It will be understood that the interstitial dielectric 50 may comprise other materials suitable for insulating semiconductor elements. After the formation of the layers of the gate stack 30, 40, 50, and 60, the gate stack is defined using photolithography and etched using a dry plasma etch.

A number of implants are performed to form the source region 80 and the drain region 90 of the FLASH cell. Before formation of the sidewall structures 70, a p-type pocket implant and a n-type drain extension implant are performed. The pocket implant is a large angle implant and results in the doping profile 100 shown in FIG. 1. The important feature of this implant is that the dopant profile of the implanted species extend under the gate stack region. In an embodiment of the instant invention, this implant comprises a $1 \times 10^{13} \text{cm}^{-2} - 6 \times 10^{13} \text{cm}^{-2}$ boron implant at 30 keV using a 15–40 degree implant angle and two way rotation. The drain extension implant results in the dopant profile 110 shown in FIG. 1. In an embodiment of the instant invention, this implant comprises a $1 \times 10^{15} \text{cm}^{-2} - 5 \times 10^{15} \text{cm}^{-2}$ arsenic implant at 30 keV. The source region 80 of the FLASH cell receives an addition self-aligned source implant that is blocked from the drain region 90. This implant results in the dopant profile 115 shown in FIG. 1. This SAS implant is necessary to push the source region under the FLASH gate stack to aid in the Fowler-Nordheim tunneling erase of the cell. The sidewall structures 70 comprise of silicon nitride or silicon nitride and are formed using standard techniques. The source junction profile 120 and the drain junction profile 125 are formed by implanting n-type dopants aligned to the sidewall structures 70. In an embodiment of the instant invention, these profiles 120, 125 are formed by implanting $1 \times 10^{15} \text{cm}^{-2} - 3 \times 10^{15} \text{cm}^{-2}$ arsenic at 50–90 keV followed by $1 \times 10^{14} \text{cm}^{-2} - 5 \times 10^{14} \text{cm}^{-2}$ phosphorous at 30–50 keV. The length of the FLASH cell is defined as being the length from the edge of the n-type region at the source 80 to the edge of the n-type region at the drain 90. This is shown as 130 in FIG. 1. To enhance the CHC injection during programming, the FLASH cell drain region 90 is designed to maximize this effect. The drain of the FLASH cell is n-type and the channel region is p-type. The rate at which the n-type doping concentration changes as one goes from the drain region to the channel region of the transistor can be defined as the drain transition region concentration gradient. One of the ways to maximize the CHC injection occurring in a FLASH memory cell is to maximize the drain transition region concentration gradient (ie. To form an abrupt junction). If the FLASH memory cell is used as a reference cell, CHC injection will occur during each read operation eventually leading to a degradation in the performance of the reference cell.

Figure 2:
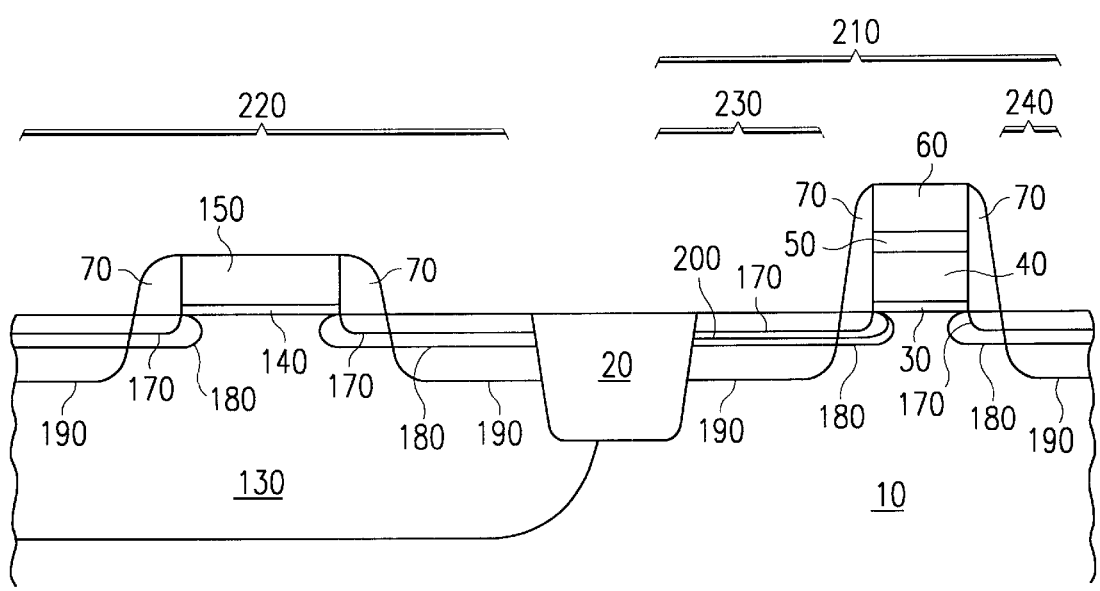
FIG. 2 is a cross-section diagram of the MOS transistor and an embedded FLASH reference cell.

Illustrated in FIG. 2 is a cross-section showing a reference cell 210 and a MOS transistor 220. It should be assumed that in an embedded FLASH memory circuit, all three transistors will be integrated in the same chip. The FLASH cell is not shown in FIG. 2 for clarity. The MOS transistor 220 comprises a gate dielectric 140 and a gate electrode 150. The gate dielectric 140 can comprise silicon oxide, silicon nitride, silicon oxynitride, or any combination of these materials. The gate electrode comprises n-type polycrystalline silicon. The MOS transistor can be formed in a separate p-well region 130 although it can be formed in the same silicon body region 10 as the FLASH memory cell and the reference cell 210. The LDD region of the MOS transistor is designed to minimize CHC injection in this structure and the pocket implant regions designed to reduce the short channel effect. In an embodiment of the instant invention, the LDD and pocket regions of the MOS transistor 170 are formed by implanting $1\times10^{15}cm^2$–$3\times10^{15}cm^2$ arsenic at 15 keV and $1\times10^{13}cm^2$–$3\times10^{13}cm^2$ boron at 25 keV, 25 degree implant angle with a 4 way rotation respectively. The source and drain junction profiles 190 of the MOS transistor are formed by implanting n-type dopants aligned to the sidewall structures 70. In an embodiment of the instant invention these regions are formed by implanting $1\times10^{15}cm^2$–$3\times10^{15}cm^2$ arsenic at 50–90 keV followed by $1\times10^{14}cm^2$–$5\times10^{14}cm^2$ phosphorous at 30–50 keV.

The FLASH reference cell 210 is fabricated using similar gate stack layers 30, 40, 50, and 60, as the FLASH memory cell. To form the source region 230 and the drain region 240 of the FLASH reference cell, the MOS transistor implant conditions are used rather than the FLASH memory cell conditions resulting in a different total source-drain doping profile. Here the drain transition region concentration gradient is less than that of the FLASH memory cell. This less abrupt (or more diffuse drain transition region) will reduce the CHC injection occurring during read operations. The drain extension region of the FLASH reference cell is formed by implanting $1\times10^{15}cm^2$–$3\times10^{15}cm^2$ arsenic at 15 keV compared to a $1\times10^{15}cm^2$–$5\times10^{15}cm^2$ Arsenic implant at 30 keV. The shallower reference cell drain extension region results less CHC injection for the same applied voltages. In addition the pocket region of the reference cell is a $1\times10^{13}cm^2$–$3\times10^{13}cm^2$ boron at 25 keV, 25 degree implant angle with a 4 way rotation compared to a $1\times10^{13}cm^2$–$6\times10^{13}cm^2$ boron implant at 30 keV using a 15–40 degree implant angle and two way rotation. The combination of the drain extension and pocket implants used in the FLASH reference cell compared to the conditions used in the FLASH memory cell results in a shallower more diffuse (graded) drain doping profile compared to a deeper more abrupt drain doping profile in the FLASH memory cell. This shallower more diffuse (graded) drain doping profile results in a more robust FLASH reference cell.

In addition to adjusting the drain doping profile, the gate length of the reference cell can be made greater than the gate length of the FLASH memory cell. Because there are much fewer reference cells compared to memory cells on the chip the increase in reference cell size will have a negligible effect on the overall chip size. In addition to gate length, the width of the gate stack of the reference cell can be made larger than the width of the gate stack of the memory cell.

In the above described embodiments the FLASH reference cell and the MOS transistors received the same drain extension and pocket implants. It should be noted however that this does not always have to be the case. It might be desirable in some cases that the MOS transistors and the FLASH reference cells have difference drain and source doping profiles and in this case these implants will have different conditions. Also MOS transistors of the type described here might not be present in the same chip as the FLAS memory array. Therefore while the presence of MOS transistor circuits provides a convenient way to fabricate the robust reference cell, the main advantage of the instant invention is that the drain doping profiles, the gate stack length, the gate stack width, and the channel doping profiles are such that the FLASH reference cell is less likely to have CHC injection compared to the case where the same structure is used for both the memory cell and the reference cell.

In addition to the read reference cell discussed above, a FLASH memory array will contain an erase reference cell, a programming reference cell and a bit compaction reference cell. According to the instant invention, the properties of these reference cells can be adjusted with respect to the FLASH memory cell. The erase referencing cell can be adjusted for robust erase referencing, the compaction reference cell adjusted for robust compaction referencing, and the programming reference cell adjusted for robust programming referencing. If one reference cell is used for all referencing, then that cell can also be adjusted.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

I claim:

1. A semiconductor memory circuit, comprising:
   an array of memory cells wherein each memory cell comprises a floating gate transistor having a first transistor gate length, a first transistor gate width, and a first drain transition region concentration gradient; and
   at least one reference cell comprising a floating gate transistor having a second transistor gate length, a second transistor gate width, and a second drain transition region concentration gradient wherein said first drain transition region concentration gradient is greater than said second drain transition region concentration gradient.

2. The integrated circuit memory circuit of claim 1 wherein said second transistor gate length is greater than said first transistor gate length.

3. The integrated circuit memory circuit of claim 1 wherein said second transistor gate width is greater than said first transistor gate width.

* * * * *